(12) United States Patent
Meldrin et al.

(10) Patent No.: US 10,438,968 B2
(45) Date of Patent: Oct. 8, 2019

(54) MEMORY ARRAYS AND METHODS OF FABRICATING INTEGRATED STRUCTURES

(71) Applicant: Micron Technology, Inc., Boise, ID (US)

(72) Inventors: John M. Meldrin, Boise, ID (US); Yushi Hu, Boise, ID (US); Rita J. Klein, Boise, ID (US); John D. Hopkins, Boise, ID (US); Hongbin Zhu, Boise, ID (US); Gordon A. Haller, Boise, ID (US); Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/924,143

(22) Filed: Mar. 16, 2018

(65) Prior Publication Data

US 2018/0204851 A1    Jul. 19, 2018

Related U.S. Application Data

(62) Division of application No. 15/049,097, filed on Feb. 21, 2016, now Pat. No. 9,935,120, which is a division
(Continued)

(51) Int. Cl.
*H01L 27/115* (2017.01)
*H01L 27/11582* (2017.01)
*H01L 29/49* (2006.01)
*H01L 27/11524* (2017.01)
*H01L 27/11556* (2017.01)
(Continued)

(52) U.S. Cl.
CPC .. *H01L 27/11582* (2013.01); *H01L 21/28097* (2013.01); *H01L 27/1157* (2013.01); *H01L 27/11524* (2013.01); *H01L 27/11556* (2013.01); *H01L 29/4975* (2013.01)

(58) Field of Classification Search
CPC ........... H01S 27/1151; H01S 27/28097; H01S 27/11556; H01S 27/11582; H01S 27/1157; H01S 27/11524; H01L 7/1151; H01L 7/28097; H01L 27/11556; H01L 27/11582; H01L 27/1157; H01L 27/11524; H01L 27/11551
See application file for complete search history.

(56) References Cited

U.S. PATENT DOCUMENTS

2003/0071572 A1    4/2003  Hibino
2009/0127633 A1    5/2009  Sel
(Continued)

FOREIGN PATENT DOCUMENTS

JP    02037726 A    2/1990

*Primary Examiner* — Michael Carter
(74) *Attorney, Agent, or Firm* — Wells St. John P.S.

(57) ABSTRACT

Some embodiments include a memory array which has a stack of alternating first and second levels. Channel material pillars extend through the stack, and vertically-stacked memory cell strings are along the channel material pillars. A common source is under the stack and electrically coupled to the channel material pillars. The common source has conductive protective material over and directly against metal silicide, with the conductive protective material being a composition other than metal silicide. Some embodiments include methods of fabricating integrated structures.

16 Claims, 7 Drawing Sheets

Related U.S. Application Data of application No. 14/281,569, filed on May 19, 2014, now Pat. No. 9,287,379.

(51) Int. Cl.
*H01L 27/1157* (2017.01)
*H01L 21/28* (2006.01)

(56) References Cited

U.S. PATENT DOCUMENTS

| | | | | |
|---|---|---|---|---|
| 2010/0171163 A1* | 7/2010 | Kim | .................. | H01L 27/11551 257/314 |
| 2011/0002178 A1* | 1/2011 | Hwang | ............. | H01L 27/11578 365/189.011 |
| 2011/0303971 A1* | 12/2011 | Lee | .................. | H01L 27/11551 257/324 |

* cited by examiner

MEMORY ARRAYS AND METHODS OF FABRICATING INTEGRATED STRUCTURES

RELATED PATENT DATA

This application is a divisional of U.S. patent application Ser. No. 15/049,097, filed Feb. 21, 2016, which is a divisional of U.S. patent application Ser. No. 14/281,569, filed May 19, 2014, now U.S. Pat. No. 9,287,379, the disclosures of which are hereby incorporated herein by reference.

TECHNICAL FIELD

Memory arrays and methods of fabricating integrated structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

A typical flash memory comprises a memory array that includes a large number of memory cells arranged in row and column fashion. The flash memory may be erased and reprogrammed in blocks.

NAND may be a basic architecture of flash memory. A NAND cell unit comprises at least one selecting device coupled in series to a serial combination of memory cells (with the serial combination commonly being referred to as a NAND string). Example NAND architecture is described with reference to a construction 2 of FIG. 1.

Figure 1:
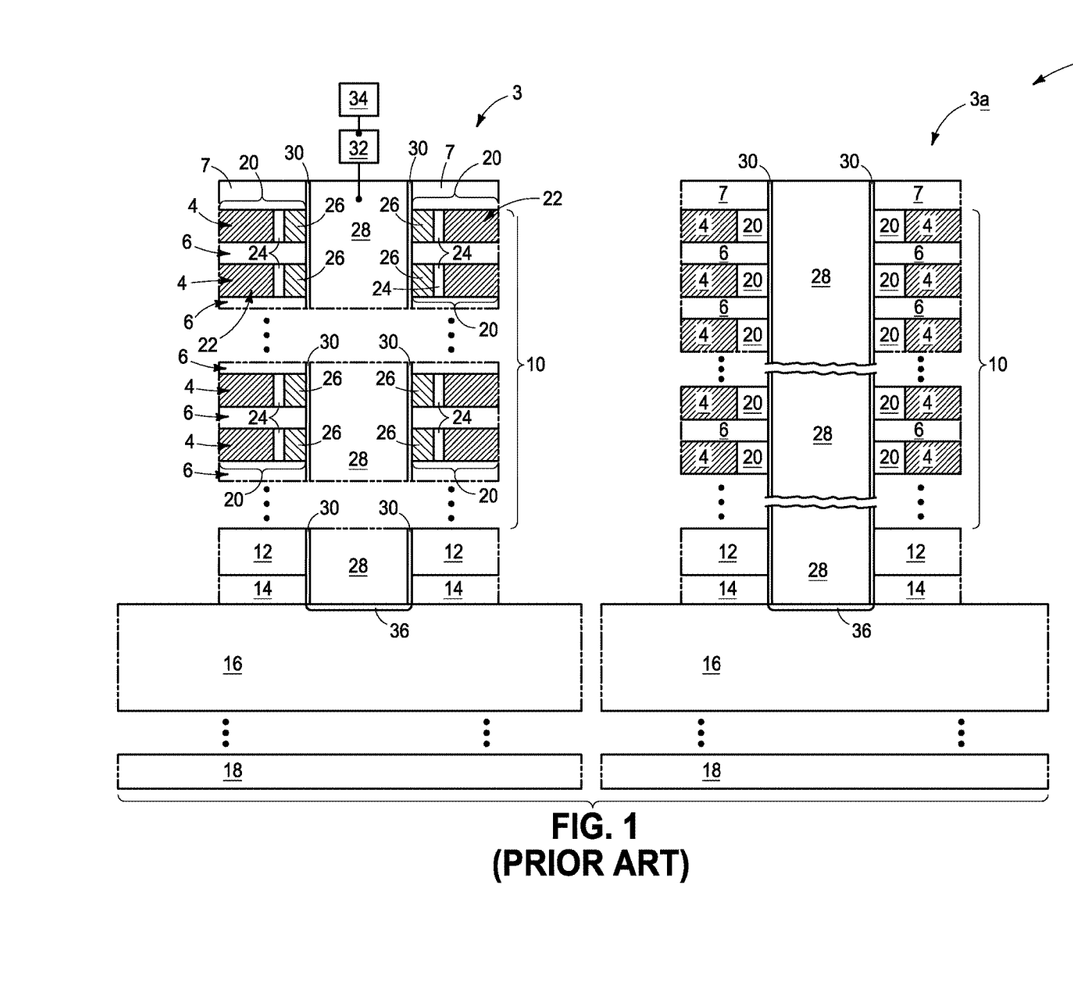
FIG. 1 is diagrammatic cross-sectional view illustrating a portion of a prior art memory array.

The construction includes a pair of memory strings 3 and 3a. The strings may be identical to one another, but string 3a is shown with less detail than string 3.

Referring to string 3, such includes a stack 10 of alternating electrically conductive levels 4 and electrically insulative levels 6. The levels 4 and 6 may comprise, for example, conductively-doped polysilicon and silicon dioxide, respectively.

A hardmask material 7 (e.g., silicon nitride) is over stack 10.

The stack 10 is over source side select gate material 12 (e.g., conductively doped polysilicon), which is over electrically insulative etch stop material 14 (e.g., aluminum oxide and/or silicon dioxide), which is over common source material 16 (e.g., tungsten silicide), which is over a semiconductor base 18 (e.g., monocrystalline silicon).

Breaks are provided within the stack 10, and between the common source material 16 and the base 18, to indicate that there may be more levels or materials than those shown in FIG. 1.

Vertically-stacked memory cells 20 are within the stack 10. The memory cells comprise control gates 22 (only some of which are labeled, and which correspond to regions of conductive levels 4), blocking dielectric 24 (e.g., one or more of silicon nitride, silicon dioxide, hafnium oxide, zirconium oxide, etc.), and charge storage material 26 (e.g., material suitable for utilization in floating gates or charge-trapping structures; such as, for example, one or more of silicon, silicon nitride, nanodots, etc.).

A channel material 28 (e.g., polysilicon) forms a pillar extending through the stack 10 to the common source material 16.

Gate dielectric material 30 (e.g., silicon dioxide) is between the channel material 28 and the charge storage material 26 of the memory cells 20.

The channel material connects to a drain side select device 32, which in turn connects to a data line (e.g., a bitline) 34.

Referring to string 3a, such also includes the stack 10, hardmask 7, source side select gate material 12, and etch stop material 14. Further, string 3a is shown to comprise the channel material 28 and gate dielectric material 30, with the channel material 28 extending to the common source material 16. The string 3a comprises memory cells of the type shown as cells 20 of string 3, but such memory cells are shown in a more simplified view in string 3a. A drain side select device (like device 32) and data line (like line 34) would also be electrically coupled with channel material of string 3a, but such are not shown.

A prior art problem is shown in locations were channel material 28 of strings 3 and 3a interfaces with common source material 16. Specifically, the common source material may react with oxygen to form an oxide 36 which is difficult to remove. The oxide 36 may problematically reduce the quality of the electrical contact between materials 16 and 28; which can impair performance of devices, and in some cases render devices non-operational.

DETAILED DESCRIPTION OF THE ILLUSTRATED EMBODIMENTS

In some embodiments, the invention includes new memory architectures having improved contact between channel region material and common source material as compared to conventional devices (such as, for example, the prior art devices of FIG. 1). In some embodiments, the invention includes new methods of fabricating integrated structures. Example embodiments are described with reference to FIGS. 2-16.

Figure 2:
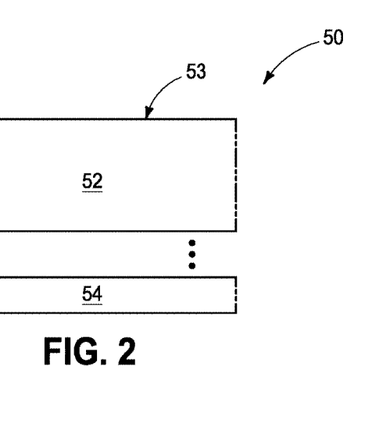
FIGS. 2-5 are diagrammatic cross-sectional views of a portion of a semiconductor construction illustrating process stages of an example embodiment method of fabricating integrated structures.

Referring to FIG. 2, a construction 50 is shown to comprise source material 52 over a base 54. The source material may be incorporated into a common source analogous to the common source 16 discussed above with reference to FIG. 1. The source material comprises oxygen-sensitive metal silicide, and in some embodiments may comprise, consist essentially of, or consist of tungsten silicide. The oxygen-sensitive metal silicide reacts with oxygen to form an undesired composition (e.g., an oxide) under the processing conditions utilized for fabricating vertically-stacked circuitry (such as, for example, vertically-stacked memory cells analogous to those of FIG. 1).

Base 54 may comprise semiconductor material, and may be analogous to the base 18 discussed above with reference to FIG. 1. For instance, base 54 may comprise, consist essentially of, or consist of monocrystalline silicon. In some embodiments, base 54 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 54 may correspond to a semiconductor substrate containing one or more materials associated with integrated circuit fabrication. Some of the materials may be under the shown region of base 54 and/or may be laterally adjacent the shown region of base 54; and may correspond to, for example, one or more of refractory metal materials, barrier materials, diffusion materials, insulator materials, etc.

The oxygen-sensitive source material 52 has an upper surface 53.

Figure 3:
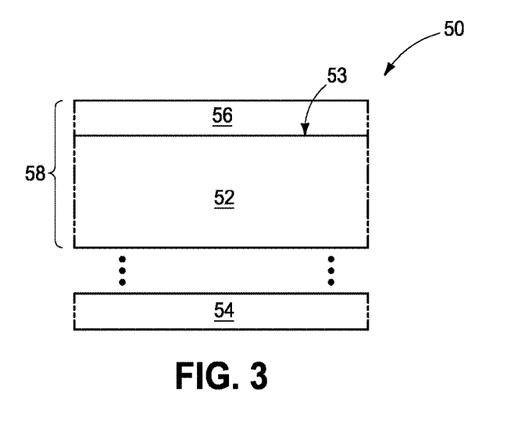

Referring to FIG. 3, protective material 56 is formed over and directly against the upper surface 53 of oxygen-sensitive material 52. The protective material is electrically conductive, and the two materials 52 and 56 may be together considered to form a conductor 58 (e.g., an electrically conductive line).

In some embodiments, protective material 56 may react with oxygen to form an oxide which is readily removed by wet or dry etch and, once removed, appreciable oxide may not grow back for a substantial period of time (for instance, more than 2 hours). In contrast, material 52 may react with oxygen almost immediately to form problematic oxide, and such problematic oxide may be difficult to remove. In some embodiments, material 56 may be stable relative to exposure to oxygen (e.g., may not react with oxygen to form undesired oxide under fabrication conditions utilized for forming vertically-stacked integrated structures; such as, for example, vertically-stacked memory cells analogous to those described above with reference to FIG. 1).

Protective material 56 may comprise any suitable electrically conductive composition. For instance, in some embodiments material 56 may comprise conductively-doped semiconductor material (e.g., conductively-doped silicon, germanium, etc.), metal, etc. The semiconductor material may be conductively-doped with either n-type dopant or p-type dopant. P-type dopant may be particularly advantageous in some embodiments.

The particular embodiment of FIG. 3 may comprise a protective material 56 corresponding to conductively-doped semiconductor material (e.g., silicon), with such semiconductor material being formed by physical vapor deposition in a process which is in situ relative to the process utilized to form oxygen-sensitive metal silicide 52. Accordingly, the upper surface 53 of material 52 is never exposed to oxygen. The in situ formation of conductor 58 may comprise utilization of a deposition apparatus which enables physical vapor deposition of metal silicide 52 in one chamber, followed by physical vapor deposition of material 56 in either the same chamber, or in another chamber, without breaking vacuum or otherwise exposing the upper surface 53 of material 52 to oxygen.

Protective material 56 may comprise any suitable thickness. In some embodiments, protective material 56 may correspond to polysilicon formed to a thickness within a range of from about 200 Å to about 1000 Å.

Figure 4:
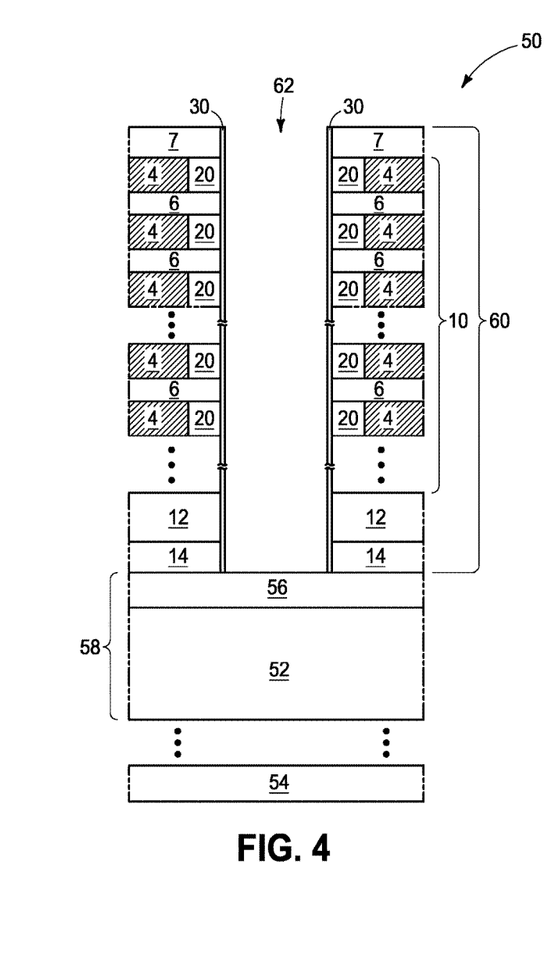

Referring to FIG. 4, a structure 60 is formed over conductor 58. In the shown embodiment, structure 60 comprises the stack 10 of alternating first and second levels 4 and 6 discussed above with reference to FIG. 1 (i.e., conductive levels 4 and insulative levels 6), comprises an opening 62 extending through the stack, and comprises repeating vertically-stacked electrical components 20 along sidewalls of the opening (with such electrical components 20 corresponding to memory cells of the type described above with reference to FIG. 1). Gate dielectric material 30 is also formed along sidewalls of the opening 62. The shown embodiment comprises the materials 7, 12 and 14 discussed above with reference to FIG. 1. The embodiment of FIG. 4 is one of numerous embodiments that may utilize the conductor 58. In other embodiments, other vertically-stacked electrical components may be utilized in addition to, or instead of, the memory cells 20. In some embodiments, other types of memory cells may be utilized instead of the particular memory cells 20 described above with reference to FIG. 1. For instance, the memory cells may be configured to have blocking dielectric (24 of FIG. 1) and/or charge-trapping material (26 of FIG. 1) in a different configuration than shown in FIG. 1.

Figure 5:
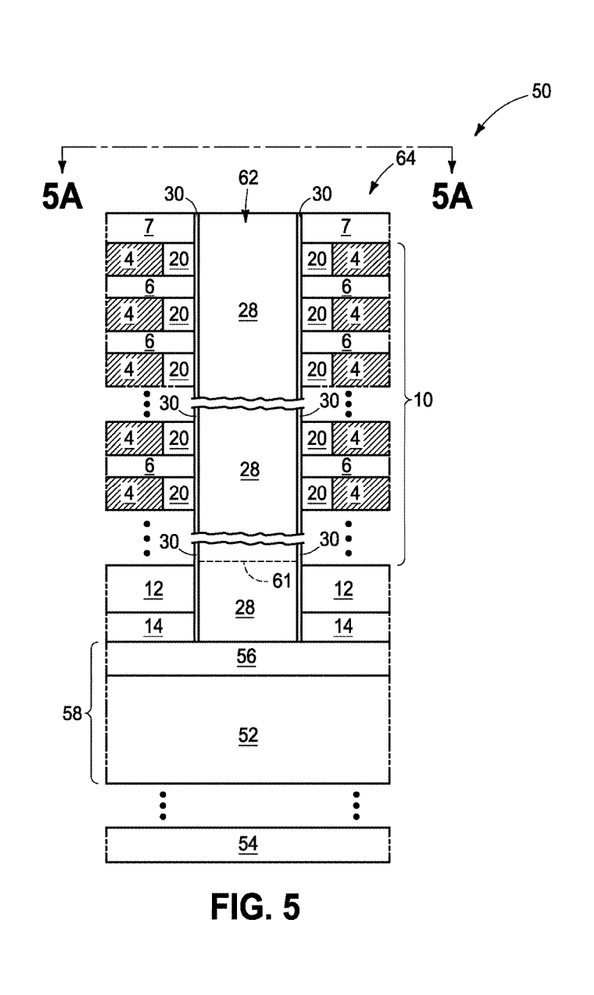

Referring to FIG. 5, channel material 28 is formed within opening 62, and is configured as a vertically-extending pillar within such opening. The channel material is directly against protective material 56 at a bottom of the opening. The processing stages of FIG. 4 and FIG. 5 may expose a bottom of opening 62 to oxygen prior to formation of channel material 28 within such opening. However, protective material 56 either reacts with oxygen too slowly to form appreciable oxide under the conditions in which it is exposed at the bottom of the opening, doesn't react with oxygen, or reacts to form readily removed oxide. In any event, the problematic oxide 36 of FIG. 1 may be avoided. The channel material 28 may comprise any suitable material, and in some embodiments may comprise silicon.

The conductor 58 forms a common source in the embodiment of FIG. 5. Such common source extends beneath a memory string 64 analogous to the strings 3 and 3a of FIG. 1. Such memory string may be one of numerous memory strings of a memory array, and the common source may extend under some or all of the strings of the memory array.

In some embodiments, one or both of materials 52 and 56 of conductor 58 may be heavily doped, and thermal processing may be utilized to out-diffuse dopant from materials of conductor 58 into a lower region of channel material 28 to heavily dope such lower region of the channel material. The heavy doping within the lower region of the channel material may enable desired current generation during operation of the channel material, and may provide a desired low resistance contact between the channel material and the conductor 58. In some embodiments, the out-diffusion of dopant from conductor 58 may create a heavily-doped lower region of channel material 28 extending to about a boundary diagrammatically illustrated with dashed line 61 in FIG. 5.

In some embodiments, material 56 of conductor 58 may be silicon which is doped in situ to a desired heavy doping. In some embodiments, metal silicide 52 may contain heavy doping, and out-diffusion from material 52 may be utilized to enhance doping within silicon-containing material 56 to provide desired heavy doping suitable for material 56 to have desired conductivity.

Figure 5A:
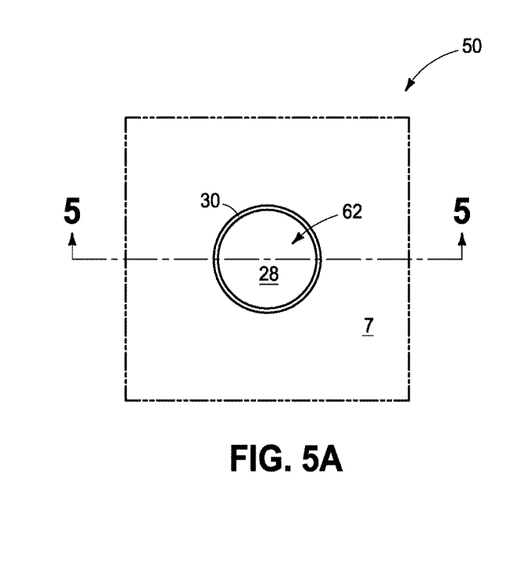
FIG. 5A is a top view of the construction of FIG. 5, and the cross-sectional view of FIG. 5 is along the line 5-5 of FIG. 5A.
Figure 6:
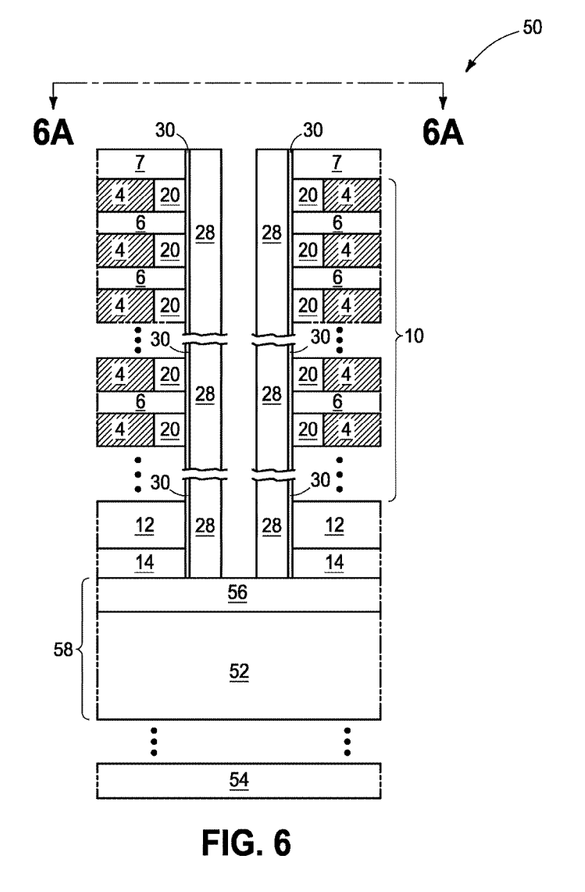
FIG. 6 is a diagrammatic cross-sectional view of an example embodiment construction alternative to that of FIG. 5.
Figure 6A:
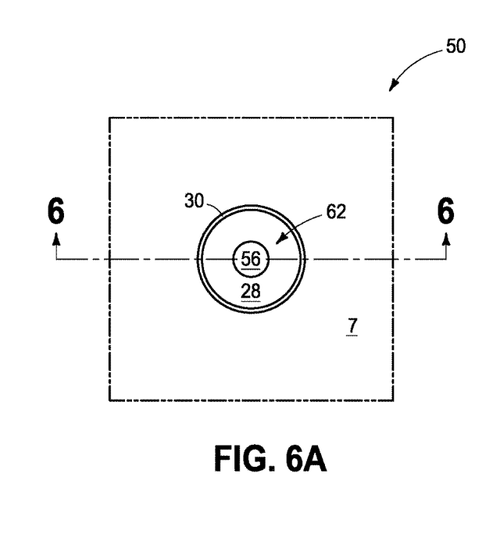
FIG. 6A is a top view of the construction of FIG. 6, and the cross-sectional view of FIG. 6 is along the line 6-6 of FIG. 6A.

The channel material 28 of FIG. 5 forms a solid conductive pillar within opening 62, as can be seen in a top view of FIG. 5A. In other embodiments, the channel material may form a hollow pillar within the opening, as shown in FIGS. 6 and 6A.

The embodiment of FIGS. 2 and 3 forms protective material 56 in situ with oxygen-sensitive metal silicide 52 so that oxide never forms across an upper surface 53 of material 52. In other embodiments, oxide may form across an upper surface of material 52, and may be removed prior to formation of protective material 56. An example embodiment in which oxide is removed is described with reference to FIGS. 7-10.

Figure 7:
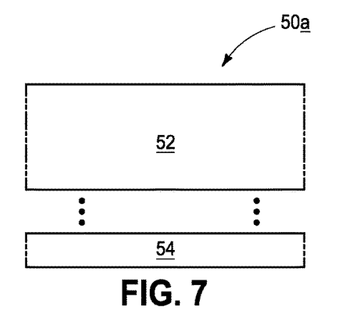
FIGS. 7-10 are diagrammatic cross-sectional views of a semiconductor construction illustrating process stages of another example embodiment method of fabricating integrated structures.

Referring to FIG. 7, a construction 50a is shown comprising oxygen-sensitive metal silicide 52 over base 54. The metal silicide may be formed by physical vapor deposition or any other suitable method.

Figure 8:
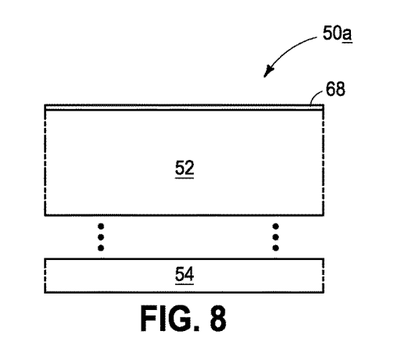

Referring to FIG. 8, metal silicide 52 is exposed to oxygen (for instance, exposed to ambient), and accordingly an oxide 68 forms across an upper surface of metal silicide 52. In the shown embodiment, the oxide forms across an entirety of the upper surface. In other embodiments only a portion of such upper surface may be exposed to oxygen, and accordingly the oxide 68 may form across only a portion of the upper surface. Regardless, oxide 68 forms across a region of the upper surface of metal silicide 52.

Figure 9:
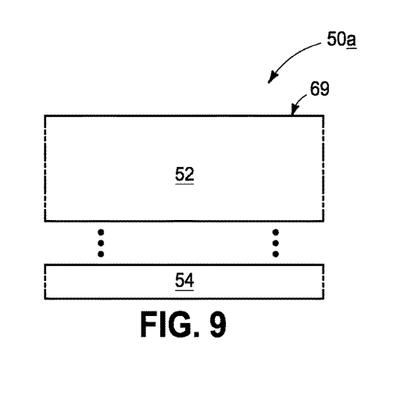

Referring to FIG. 9, oxide 68 (FIG. 8) is removed from over the metal silicide 52 to expose a clean surface 69 of the metal silicide. The oxide may be removed utilizing any suitable processing; and in some embodiments may be removed by exposure to one or more reductants. Such reductants may comprise, for example, $H_2$, $NH_3/NF_3$, etc.

Figure 10:
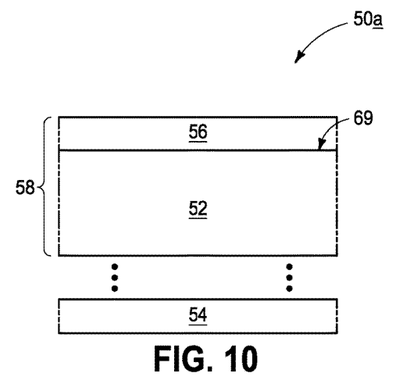

Referring to FIG. 10, protective material 56 is formed on the clean surface 69 of metal silicide 52 to form the conductor 58. The protective material may be formed with processing that does not expose the clean surface 69 to air (or any other source of oxygen) in order to avoid problematic oxide formation. The protective material 56 may be formed utilizing any suitable method, including, for example, methodology discussed above with reference to FIG. 3, or methodology discussed below with reference to other embodiments. Accordingly, in some embodiments protective material 56 of FIG. 10 may comprise conductively-doped semiconductor material (e.g., silicon, germanium, etc.), and in some embodiments protective material 56 of FIG. 10 may comprise metal. The construction 50a of FIG. 10 may be subjected to subsequent processing analogous to that of FIGS. 4 and 5 (or that of FIGS. 4 and 6) to form vertically-stacked electrical components over the conductor 58; and to have a solid or hollow channel material pillar in contact with material 56.

The embodiment of FIG. 3 formed an entirety of semiconductor-containing protective material 56 in a single deposition. In other embodiments, material 56 may be formed utilizing two or more depositions of semiconductor material. An example embodiment in which the protective material is formed utilizing multiple depositions is described with reference to FIGS. 11 and 12.

Figure 11:
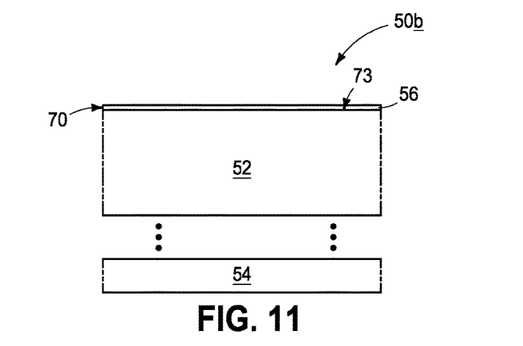
FIGS. 11 and 12 are diagrammatic cross-sectional views of a semiconductor construction illustrating process stages of another example embodiment method of fabricating integrated structures. The process stage of FIG. 11 may follow either the process stage of FIG. 2 or the process stage of FIG. 9 in some embodiments.

Referring to FIG. 11, a construction 50b is shown at a processing stage subsequent to that of FIG. 2. A first portion 70 of protective material 56 is formed on an upper surface 73 of metal silicide 52 by physical vapor deposition of semiconductor material (e.g., silicon). The first portion may comprise any suitable thickness. In some example embodiments, portion 70 may comprise a thickness of less than or equal to about 30 Å. In some example embodiments, portion 70 may comprise a thickness of from about 30 Å to about 300 Å. The first portion may or may not be conductively doped at the process stage of FIG. 11.

Figure 12:
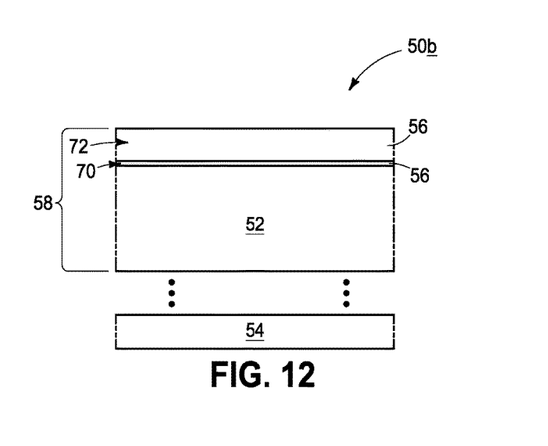

Referring to FIG. 12, a second portion 72 of protective material 56 is formed over the first portion. The second portion may be formed utilizing any suitable method, including, for example, one or more of epitaxial growth, chemical vapor deposition, atomic layer deposition, etc. In some embodiments, the second portion 72 is formed with a different method than that utilized to form the first portion 70; and specifically may be formed by a method which is faster and/or otherwise more cost-effective than the method utilized to form the first portion 70. The second portion 72 may or may not be conductively-doped as-formed. For instance, in some embodiments, dopant may be provided within the second portion after deposition of the second portion using out-diffusion of dopant from one or both of metal silicide 52 and first portion 70; in some embodiments second portion 72 may be doped during deposition of the second portion; and in some embodiments second portion 72 may be doped using an implant. Similarly, in some embodiments first portion 70 may be doped after deposition of the first portion using out-diffusion of dopant from one or both of metal silicide 52 and the second portion 72; in some embodiments may be doped during deposition of the first portion; and in some embodiments may be doped using an implant.

The first and second portions 70 and 72 may have any suitable thicknesses. In some embodiments, portion 70 may be formed to thickness of from about 30 Å to about 300 Å, and portion 72 may be formed to thickness of from about 200 Å to about 1000 Å.

Although the first and second portions are shown comprising a same composition 56 as one another, in other embodiments the first and second portions may comprise different compositions relative to one another. For instance, one of the first and second portions may primarily comprise germanium while the other primarily comprises silicon.

The portions 70 and 72 of protective material 56, together with metal silicide 52, form a conductor 58. The construction 50b of FIG. 12 may be subjected to subsequent processing analogous to that of FIGS. 4 and 5 (or that of FIGS. 4 and 6) to form vertically-stacked electrical components over the conductor 58; and to have a solid or hollow channel material pillar in contact with material 56.

Figure 13:
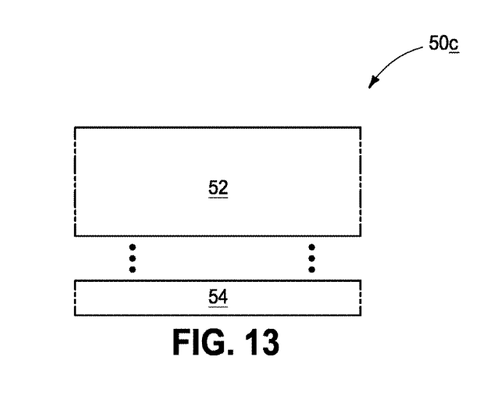
FIGS. 13-15 are diagrammatic cross-sectional views of a portion of a semiconductor construction illustrating process stages of another example embodiment method of fabricating integrated structures.
Figure 14:
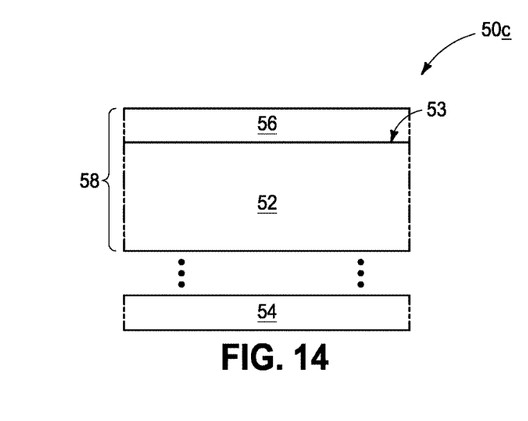
Figure 15:
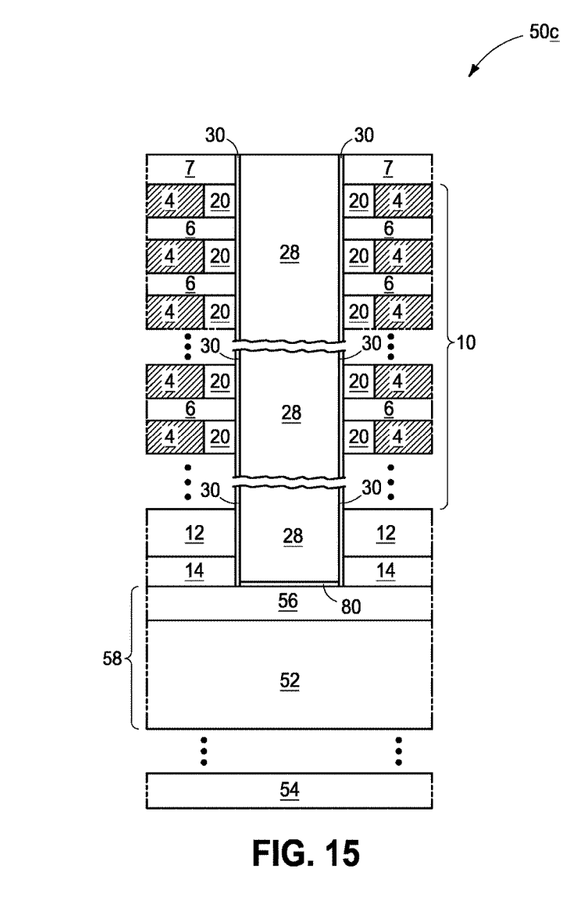

FIGS. 13-15 illustrate an example embodiment in which protective material 56 comprises metal.

Referring to FIG. 13, a construction 50c is shown at a processing stage identical to that described above with reference to FIG. 2. The construction comprises oxygen-sensitive metal silicide 52 over base 54.

Referring to FIG. 14, metal-containing protective material 56 is formed over and directly against an upper surface 53 of metal silicide 52. Metal of material 56 may be referred to as a second metal to distinguish it from the first metal of metal silicide 52. The first and second metals may be the same as one another in some embodiments, and may be different from one another in other embodiments. For instance, in some embodiments metal silicide 52 may comprise, consist essentially of, or consist of tungsten silicide; and protective material 56 may comprise, consist essentially of, or consist of tungsten.

Metal-containing protective material 56 may be formed by physical vapor deposition in a process which is in situ relative to the process utilized to form oxygen-sensitive metal silicide 52. Accordingly, an upper of material 52 is never exposed to oxygen. The in situ formation of conductor 58 may comprise utilization of a deposition apparatus which enables physical vapor deposition of metal silicide 52 in one chamber, followed by physical vapor deposition of metal-containing material 56 in either the same chamber, or in another chamber, without breaking vacuum or otherwise exposing the upper surface 53 of material 52 to oxygen.

The protective material 56 may be formed to any suitable thickness, and in some embodiments may be formed to thickness of from about 100 Å to about 1000 Å.

The protective material 56 and metal silicide 52 together form a conductor 58.

Referring to FIG. 15, subsequent processing analogous to that described above with reference to FIGS. 4 and 5 may be utilized to form vertically-stacked electrical components over conductor 58 of construction 50c. The channel material 28 extends through the stacked electrical components and to the conductor 58. In some embodiments, channel material 28 may directly contact an upper surface of material 56 analogously to the construction shown in FIG. 5. In other embodiments, channel material may be spaced from protective material 56 by an intervening material 80 as shown in FIG. 15. For instance, in some embodiments channel material 28 may comprise silicon, and such silicon may react with an upper surface of metal-containing material 56 to form a metal silicide. In particular embodiments, material 56 may comprise, consist essentially of, or consist of tungsten; and material 80 may comprise, consist essentially of, or consist of tungsten silicide.

In the embodiment of FIG. 15, metal silicide 52 may be provided with dopant dispersed therein, and such dopant may be out-diffused through materials 56 and 80, and into a lower region of channel material 28 to heavily dope such lower region in a manner analogous to the out-diffusion discussed above with reference to FIG. 5.

Although the embodiment of FIG. 15 shows channel material 28 as a solid pillar, in other embodiments the channel material may be a hollow pillar analogous to the hollow pillar shown in FIG. 6.

Figure 16:
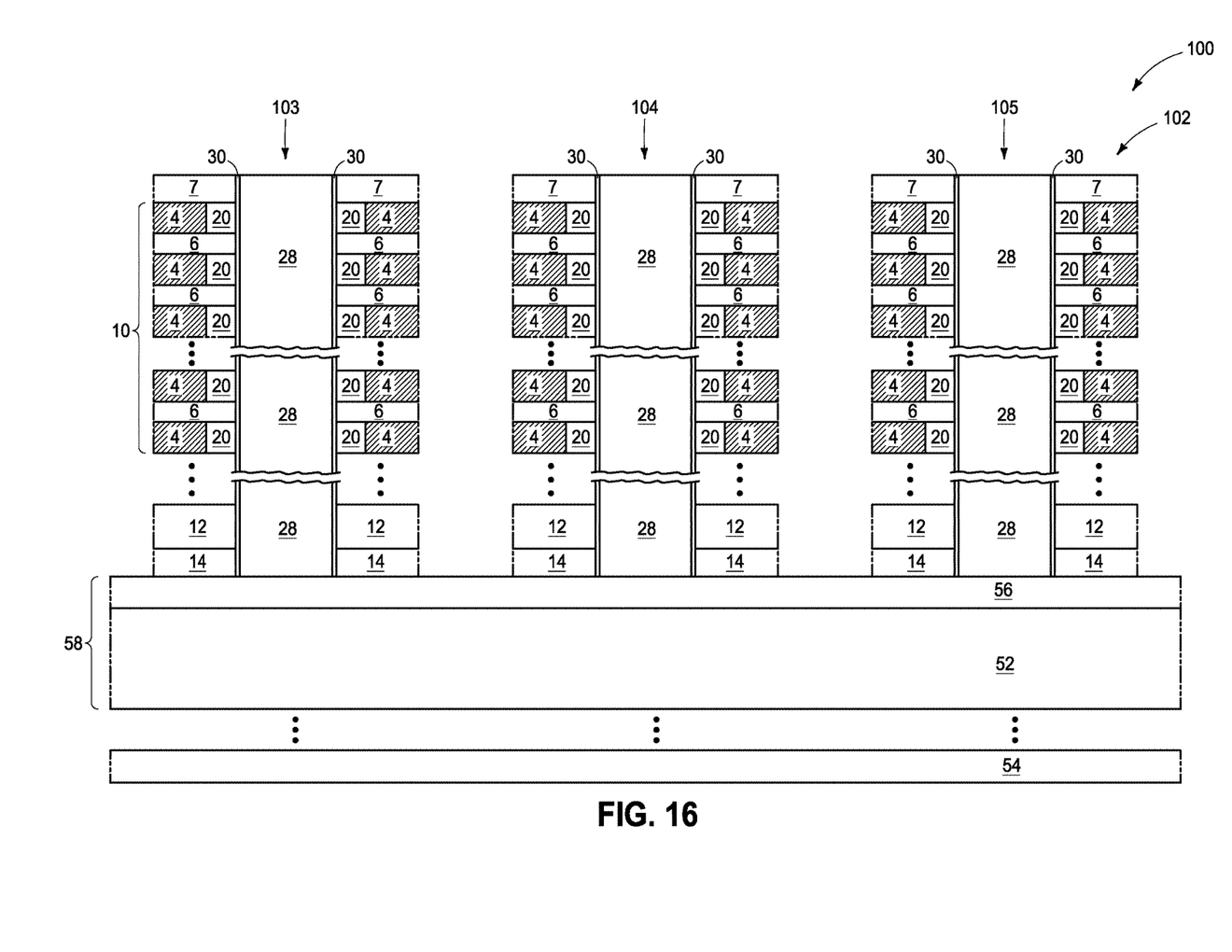
FIG. 16 is a diagrammatic cross-sectional view of a portion of a semiconductor construction comprising an example embodiment memory array.

In some embodiments, the conductors 58 of the above-discussed embodiments may be utilized as a common source in memory arrays. FIG. 16 shows a construction 100 comprising a memory array 102 containing multiple NAND strings 103-105 associated with a common source corresponding to conductor 58. The memory strings may comprise embodiments in accordance with those described above with reference to FIGS. 2-15. Although the channel material pillars of FIG. 16 are shown as solid pillars, in other embodiments they may be hollow pillars of the type shown in FIG. 6.

The structures and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array which has a stack of alternating first and second levels. Channel material pillars extend through the stack, and vertically-stacked memory cell strings are along the channel material pillars. A common source is under the stack and electrically coupled to the channel material pillars. The common source comprises conductive protective material over and directly against metal silicide. The conductive protective material comprises a composition other than metal silicide.

Some embodiments include a method of fabricating integrated structures. A conductor is formed to comprise conductive protective material over and directly against oxygen-sensitive metal silicide. A structure is formed over the conductor. The structure comprises a stack of alternating first and second levels, an opening extending through the stack to the conductive protective material, and repeating vertically-stacked electrical components along the stack at sidewalls of the opening. Channel material is formed within the opening and directly against the conductive protective material.

Some embodiments include a method of fabricating integrated structures. Conductive protective material is formed over an oxygen-sensitive metal silicide. A stack of alternating first and second levels is formed over the conductive protective material. An opening is formed to extend through the stack to the conductive protective material. Channel material is formed within the opening and directly against the conductive protective material. Dopant is out-diffused from one or both of the conductive protective material and the metal silicide into a bottom region of the silicon-containing channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory array, comprising:
a stack of alternating first and second levels;
channel material pillars extending through the stack;
vertically-stacked memory cell strings along the channel material pillars;
a common source under the stack and electrically coupled to the channel material pillars; the channel material pillars contact the common source; the common source comprising conductive protective material over and directly against metal silicide; the conductive protective material comprising a composition other than metal silicide;
wherein the conductive protective material comprises metal; and
wherein the conductive protective material comprises a plurality of discrete layers.

2. The memory array of claim 1 wherein the metal silicide comprises tungsten silicide, and wherein the conductive protective material comprises tungsten.

3. The memory array of claim 1 wherein the channel material pillars comprise silicon, and wherein silicon of the channel material pillars directly contacts metal silicide, which in turn directly contacts the conductive protective material.

4. The memory array of claim 1 wherein the channel material pillars contact the conductive protective material.

5. The memory array of claim 1 wherein at least one channel material pillar comprises a hollow structure.

6. The memory array of claim 1 wherein at least one channel material pillar comprises conductive material across an entirety of the cross section of the at least one channel material pillar.

7. A memory array, comprising:
a stack of alternating first and second levels;
channel material pillars extending through the stack, the channel material pillars comprising a hollow structure;
vertically-stacked memory cell strings along the channel material pillars;
a common source under the stack and electrically coupled to the channel material pillars;
a conductive protective material over the common source; and
wherein the channel material pillars comprise silicon directly contacting the conductive protective material.

8. The memory array of claim 7 wherein the conductive protective material comprises a plurality of discrete layers.

9. The memory array of claim 7 further comprising a metal silicide between the channel material pillars and the conductive protective material.

10. A memory array, comprising:
a stack of alternating first and second levels;
channel material pillars extending through the stack, conductive material across an entirety of the cross section of the channel material pillars;
vertically-stacked memory cell strings along the channel material pillars;
a common source under the stack and electrically coupled to the channel material pillars;
a conductive protective material over the common source; and
wherein the channel material pillars comprise silicon directly contacting the conductive protective material.

11. The memory array of claim 10 wherein the conductive protective material comprises a plurality of discrete layers.

12. The memory array of claim 10 further comprising a metal silicide between the channel material pillars and the conductive protective material.

13. A memory array, comprising:
a stack of alternating first and second levels;
channel material pillars extending through the stack;
vertically-stacked memory cell strings along the channel material pillars;
a common source under the stack and electrically coupled to the channel material pillars; the common source comprising conductive protective material over and directly against metal silicide; the conductive protective material comprising a composition other than metal silicide;
wherein the conductive protective material comprises metal; and
wherein the channel material pillars comprise silicon, and wherein silicon of the channel material pillars directly contacts metal silicide, which in turn directly contacts the conductive protective material.

14. A memory array, comprising:
a stack of alternating first and second levels;
channel material pillars extending through the stack;
vertically-stacked memory cell strings along the channel material pillars;
a common source under the stack and electrically coupled to the channel material pillars; the channel material pillars contact the common source; the common source comprising conductive protective material over and directly against metal silicide; the conductive protective material comprising a composition other than metal silicide;
wherein the conductive protective material comprises metal; and
wherein the channel material pillars comprise silicon, and wherein silicon of the channel material pillars directly contacts metal silicide, which in turn directly contacts the conductive protective material.

15. A memory array, comprising:
a stack of alternating first and second levels;
channel material pillars extending through the stack, the channel material pillars comprising a hollow structure;
vertically-stacked memory cell strings along the channel material pillars;
a common source under the stack and electrically coupled to the channel material pillars;
a conductive protective material over the common source; and
wherein the conductive protective material comprises a plurality of discrete layers.

16. A memory array, comprising:
a stack of alternating first and second levels;
channel material pillars extending through the stack, conductive material across an entirety of the cross section of the channel material pillars;
vertically-stacked memory cell strings along the channel material pillars;

a common source under the stack and electrically coupled to the channel material pillars;
a conductive protective material over the common source; and
wherein the conductive protective material comprises a plurality of discrete layers.

* * * * *